United States Patent
Oh (10) Patent No.: US 10,455,693 B2
(45) Date of Patent: Oct. 22, 2019

(54) DISPLAY DEVICE COMPRISING REMAINING PORTION OF INSPECTION LINE WITH CUT EDGE

(71) Applicant: Samsung Display Co., Ltd., Yongin, Gyeonggi-Do (KR)

(72) Inventor: Myong soo Oh, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 308 days.

(21) Appl. No.: 14/724,370

(22) Filed: May 28, 2015

(65) Prior Publication Data

US 2016/0165718 A1  Jun. 9, 2016

(30) Foreign Application Priority Data

Dec. 8, 2014 (KR) .................. 10-2014-0175118

(51) Int. Cl.

| G02F 1/1345 | (2006.01) |
|---|---|
| H05K 1/02 | (2006.01) |
| H01L 27/12 | (2006.01) |
| H01L 21/66 | (2006.01) |
| H01L 23/498 | (2006.01) |

(Continued)

(52) U.S. Cl.
CPC ......... *H05K 1/0268* (2013.01); *G02F 1/1309* (2013.01); *G02F 1/13458* (2013.01); *H01L 22/32* (2013.01); *H01L 23/4985* (2013.01); *H01L 27/124* (2013.01); *H01L 27/1218* (2013.01); *H01L 27/1244* (2013.01); *H05K 1/147* (2013.01); *H01L 24/50* (2013.01); *H01L 24/86* (2013.01); *H01L 2924/1426* (2013.01); *H05K 1/111* (2013.01); *H05K 3/323* (2013.01);

(Continued)

(58) Field of Classification Search
CPC ....... G02F 1/1309; G02F 2001/136254; G02F 1/13458; H01L 22/32; H01L 24/50; H01L 24/86; H01L 2224/80052; H05K 1/0268; H05K 1/111; H05K 1/118; H05K 1/181; H05K 1/189; H05K 1/147; H05K 2201/10681

See application file for complete search history.

(56) References Cited

U.S. PATENT DOCUMENTS

| 5,949,502 A * | 9/1999 | Matsunaga | G02F 1/1345 |
| | | | 349/40 |
| 6,628,364 B2 * | 9/2003 | Yeo | G02F 1/1345 |
| | | | 349/151 |

(Continued)

FOREIGN PATENT DOCUMENTS

| KR | 1998-060009 A | 10/1998 |
| KR | 10-2008-0008703 A | 1/2008 |

(Continued)

*Primary Examiner* — Paisley L Arendt (74) *Attorney, Agent, or Firm* — H.C. Park & Associates, PLC (57) ABSTRACT

A display device includes: a substrate including a display area in which a plurality of pixels are disposed and a non-display area adjacent to the display area; a plurality of pads disposed in the non-display area; an inspection line disposed in the non-display area of the substrate and being spaced apart from the pad; a conductive member connecting the pad and the inspection line; and a tape-automated bonding integrated circuit (TAB-IC) disposed on the conductive member.

18 Claims, 9 Drawing Sheets

(51) Int. Cl.
  *H05K 1/14*      (2006.01)
  *G02F 1/13*      (2006.01)
  *H05K 1/11*      (2006.01)
  *H01L 23/00*     (2006.01)
  *H05K 3/32*      (2006.01)

(52) U.S. Cl.
  CPC ................ *H05K 2201/0326* (2013.01); *H05K 2201/10128* (2013.01)

(56) References Cited

U.S. PATENT DOCUMENTS

2008/0143944 A1    6/2008  Chang et al.
2009/0294771 A1\*  12/2009  Kim .................. G02F 1/136204
                                                              257/59

FOREIGN PATENT DOCUMENTS

KR    10-2008-0054620 A    6/2008
KR    10-2012-0075095 A    7/2012

\* cited by examiner

FIG. 1

Related Art

FIG. 2

Related Art

FIG. 3

Related Art

FIG. 4

Related Art

FIG. 5

Related Art

DISPLAY DEVICE COMPRISING REMAINING PORTION OF INSPECTION LINE WITH CUT EDGE

CLAIM PRIORITY

This application claims priority to and claims all benefits accruing under 35 U.S.C. § 119 from an application earlier filed in Korean Patent Application No. 10-2014-0175118, filed on Dec. 8, 2014, with the Korean Intellectual Property Office, the disclosure of which is incorporated herein in its entirety by reference.

BACKGROUND

1. Field of Disclosure

Embodiments of the present invention relate to a display device, and more particularly, to a display device having a narrow bezel.

2. Description of the Related Art

Display devices are classified into liquid crystal displays (LCDs), organic light emitting diode displays (OLEDs), plasma display panels (PDPs), electrophoretic displays, and the like, based on a driving scheme of a display panel.

A display panel is divided into a display area displaying an image, and a non-display area around edges of the display area. A display panel includes a plurality of gate lines, a plurality of data lines, and a plurality of pixels disposed in the display area. In addition, a display panel includes a plurality of pads disposed in the non-display area.

A drive integrated circuit (IC), for example, a gate IC or a data IC, for driving a display panel may be bonded to a pad in a form of a tape-automated bonding-IC (TAB-IC). Such a TAB-IC includes a tape carrier package (TCP) in which a drive IC having a chip shape is mounted on a polymer film, and a chip on film (COF) in which a drive IC having a chip shape is mounted on a flexible printed circuit board (FPCB).

Meanwhile, in a case of defects being detected in a TAB-IC, it may be required that the TAB-IC be removed from a display panel in order to reuse the display panel. In this case, during a process of separating the TAB-IC from the display panel, a pad of the display panel may be separated from the display panel along with the TAB-IC, thus leading to a difficulty in reusing the display panel.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a display device capable of preventing damage to a pad likely to occur at the time of a tape-automated bonding integrated circuit (TAB-IC) being separated from a display panel in order to reuse the display panel.

According to an exemplary embodiment of the present invention, a display device includes: a substrate including a display area in which a plurality of pixels are disposed and a non-display area adjacent to the display area; a plurality of pads disposed in the non-display area; an inspection line disposed in the non-display area of the substrate and being spaced apart from the pad; a conductive member connecting the pad and the inspection line; and a TAB-IC disposed on the conductive member.

The display device may further include a gate line and a data line disposed on the substrate, wherein the pad is connected to the gate line and the data line.

The inspection line may be disposed in an outer portion of the non-display area than the pad.

The inspection line may be spaced apart from the pad by a distance in a range of about 5 micrometers (µm) to 50 µm.

The conductive member may be disposed on the pad and the inspection line.

The pad and the inspection line may include at least one selected from the group consisting of chrominum (Cr), aluminum (Al), molibden (Mo), titanium (Ti), tungsten (W), and gold (Au).

The conductive member may include at least one selected from the group consisting of indium tin oxide (ITO), indium zinc oxide (IZO), indium tin zinc oxide (ITZO), and zinc oxide (ZnO).

The TAB-IC may include a flexible printed circuit board (FPCB), a drive integrated circuit (IC) mounted on the FPCB, and a lead wiring extending from the drive IC.

The drive IC may include one selected from the group consisting of a gate IC and a data IC.

The lead wiring may be electrically connected to the conductive member.

The display device may further include an anisotropic conductive film (ACF) disposed between the lead wiring and the conductive member.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first", "second", and the like, may be used herein to describe various elements, components, areas, layers and/or sections, these elements, components, areas, layers and/or sections should not be limited by these terms. These terms are only used to distinguish one element, component, area, layer or section from another element, component, area, layer or section. Thus, a first element, component, area, layer or section discussed below could be termed a second element, component, area, layer or section without departing from the teachings of example embodiments.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

A display device according to an exemplary embodiment of the present invention may be applied to a liquid crystal display (LCD), an organic light emitting diode display (OLED), or a plasma display panel (PDP).

In the display device according to the exemplary embodiment, a drive integrated circuit (IC), for example, a gate IC or a data IC, for driving a display panel may be bonded to a pad of the display panel in a tape-automated bonding-IC (TAB-IC) manner.

Hereinafter, a TAB-IC will be assumed to be a chip on film (COF) in which a drive IC having a chip shape is mounted on a flexible printed circuit board (FPCB) for ease of description.

Figure 1:
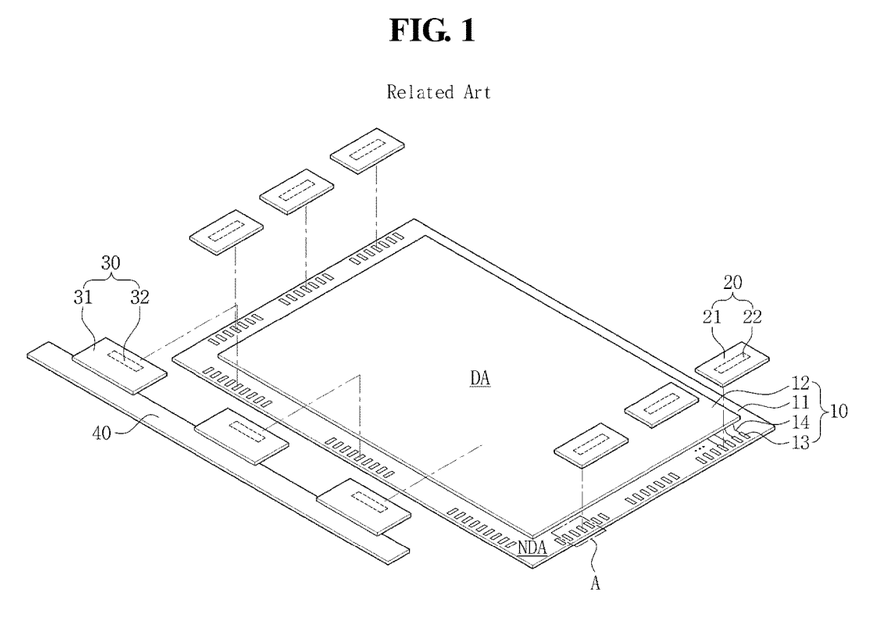
FIG. 1 is a schematic perspective view illustrating a display device according to the related art.
Figure 2:
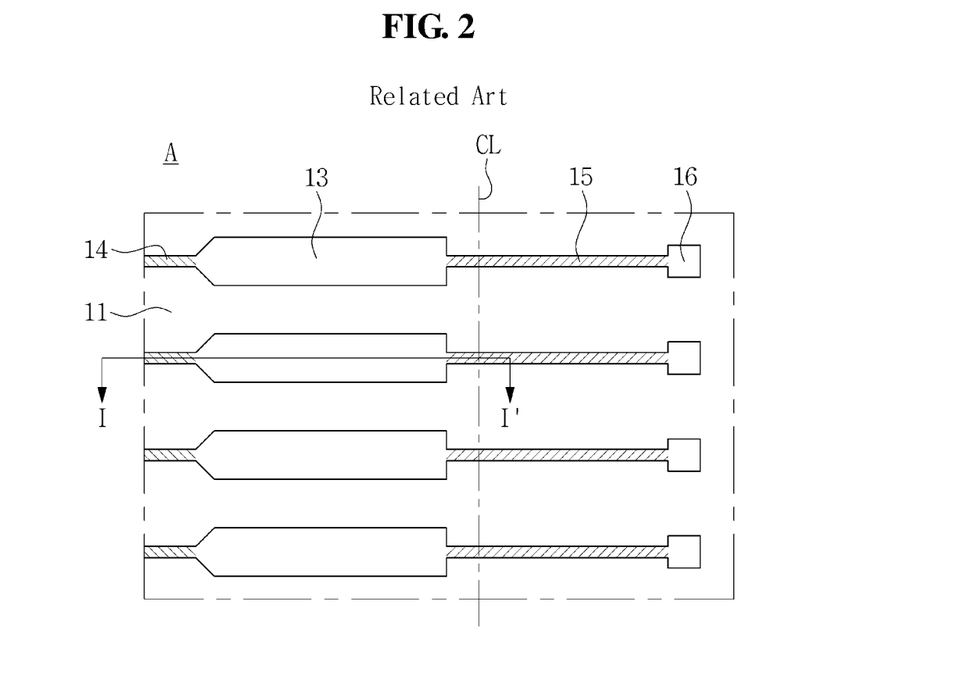
FIG. 2 is an enlarged partial view of area "A" of FIG. 1.

FIG. 1 is a schematic perspective view illustrating a display device according to the related art; FIG. 2 is an enlarged partial view of area "A" of FIG. 1; and FIG. 3 is a cross-sectional view taken along line I-I' of FIG. 2.

Figure 3:
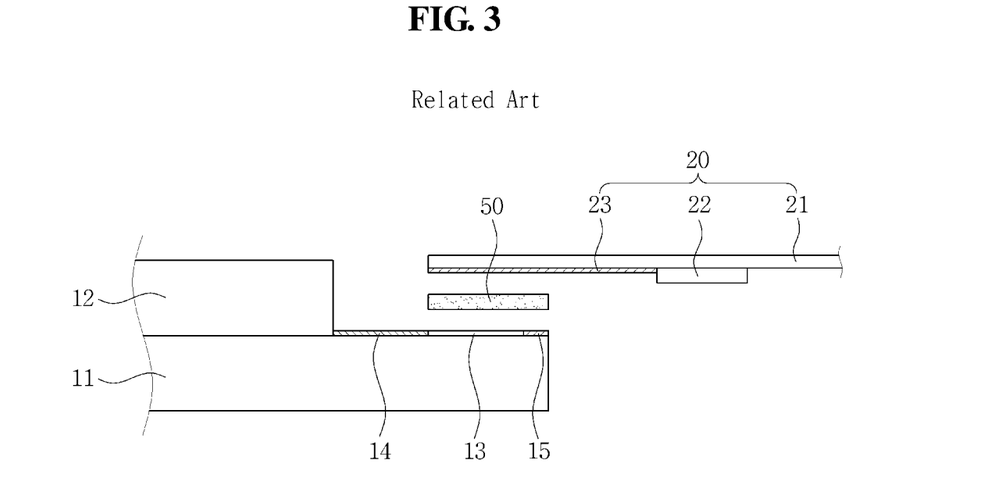
FIG. 3 is a cross-sectional view taken along line I-I' of FIG. 2.

Referring to FIGS. 1 through 3, a display device according to the related art may include a display panel 10 including a first substrate 11 and a second substrate 12 disposed to oppose one another, and a plurality of pads 13 disposed in an edge portion of the first substrate 11, a gate TAB-IC 20 and a data TAB-IC 30 bonded to the pad 13 of the first substrate 11, and a printed circuit board (PCB) 40 connected to the data TAB-IC 30.

The display panel 10 may be divided into a display area (DA) displaying an image and a non-display area (NDA) in an edge portion of the DA. The display panel 10 may include a gate line (not illustrated), a data line (not illustrated), a thin film transistor (TFT), and a pixel electrode (not illustrated) disposed in the DA.

The display panel 10 may include a plurality of pads 13 and connection wirings 14 disposed in the NDA. The pad 13 may transfer various types of externally supplied drive signals, and the wiring pad 14 may connect the gate line or the data line and the pad 13 to one another.

The gate TAB-IC 20 may include an FPCB 21, a gate IC 22 mounted on the FPCB 21, and a lead wiring 23 extending from the gate IC 22.

Similarly, the data TAB-IC 30 may include an FPCB 31, a data IC 32 mounted on the FPCB 31, and a lead wiring (not illustrated) extending from the data IC 32.

The lead wiring 23 of the gate TAB-IC 20 and the lead wiring of the data TAB-IC 30 may be bonded to the pad 13 of the first substrate 11. The lead wiring 23 of the gate TAB-IC 20 and the pad 13 of the first substrate 11 may be electrically connected to one another using an anisotropic conductive film (ACF) 50. The ACF 50 may be a thermosetting resin film including conductive particles.

Meanwhile, a visual inspection (VI) for inspecting a presence of defects in the display panel 10 may be conducted prior to the bonding of the gate TAB-IC 20 and the data TAB-IC 30 to one another. A VI refers to detecting defects such as short-circuit faults or open circuit faults occurring between gate lines, data lines, and pixels by applying inspection signals to the gate lines and the data lines, respectively.

Figure 4:
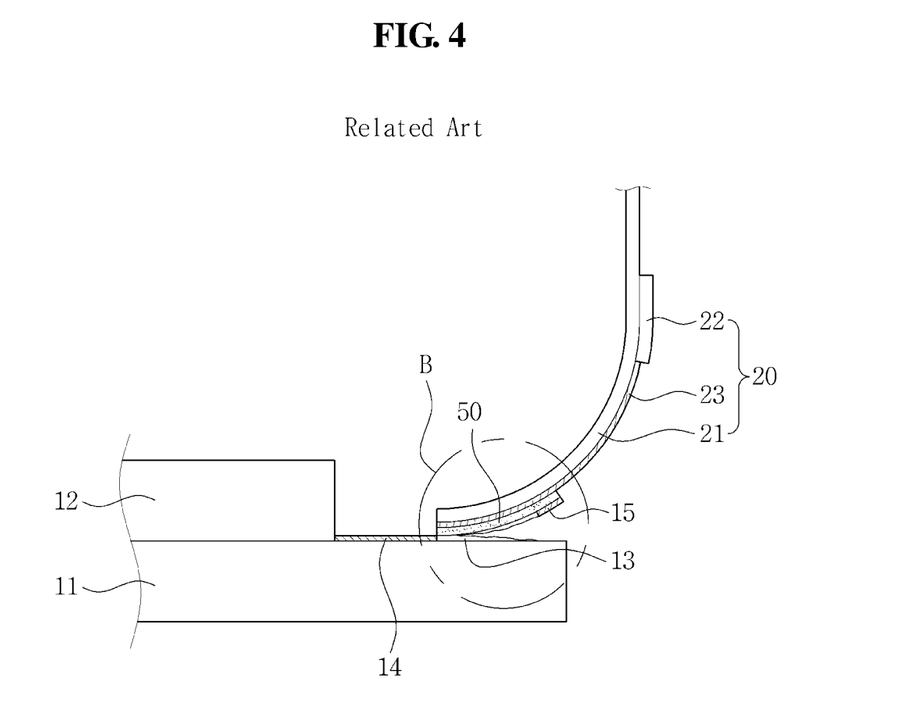
FIG. 4 is a cross-sectional view illustrating an example in which a tape-automated bonding integrated circuit (TAB-IC) is separated from a display panel according to the related art.
Figure 5:
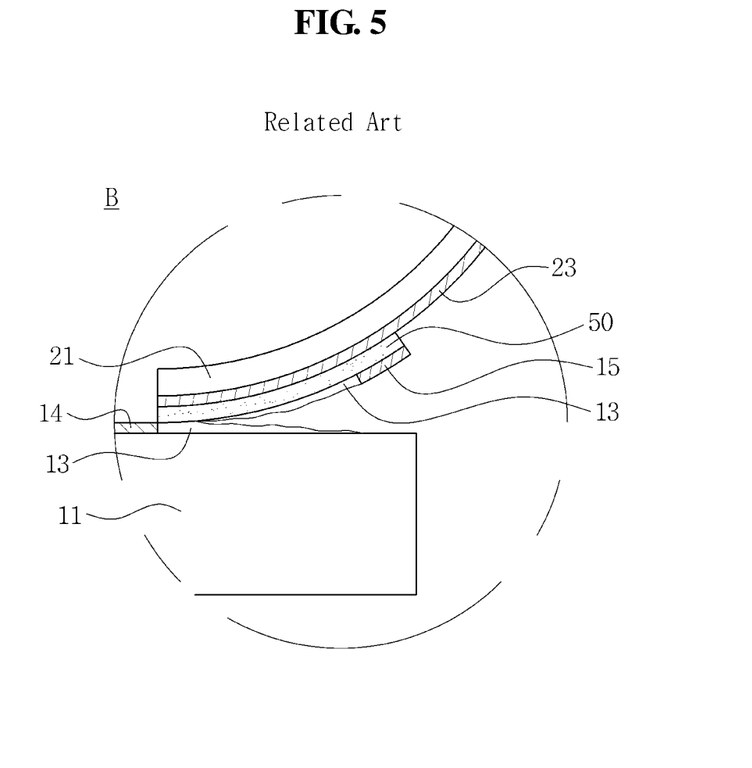
FIG. 5 is an enlarged partial view of area "B" of FIG. 4.

FIG. 4 is a cross-sectional view illustrating an example in which a TAB-IC is separated from a display panel according to the related art; and FIG. 5 is an enlarged partial view of area "B" of FIG. 4.

Referring to FIGS. 2 through 5, an inspection line 15 and an inspection pad 16 may be disposed in an edge portion of the first substrate 11. One end of the inspection line 15 may be connected to the pad 13, and the other end of the inspection line 15 may be connected to the inspection pad 16. A VI device (not illustrated) may perform a VI by transmitting inspection signals to the gate lines and the data lines through the inspection pad 16, respectively.

When the VI is completed, a display panel 10 having a narrow bezel may be formed by cutting the first substrate 11 along a cutting line CL. In this instance, a portion of the inspection line 15 connected to the pad 13 may remain on the first substrate 11.

Meanwhile, during the process of cutting the first substrate 11, bonding strength between the portion of the inspection line 15 remaining on the first substrate 11 and the first substrate 11 may be lessened. Consequently, at the time of separating the TAB-ICs 20 and 30 bonded onto the pad 13 and the portion of the inspection line 15 remaining on the first substrate 11, the portion of the inspection line 15 remaining on the first substrate 11 may be peeled off from first substrate 11 together with the TAB-ICs 20 and 30. Due to the portion of the inspection line 15 remaining on the first substrate 11 being peeled off from first substrate 11, the pad 13 connected to the portion of the inspection line 15 remaining on the first substrate 11 may be entirely peeled off together with the portion of the inspection line 15 remaining on the first substrate 11 from first substrate 11.

In this regard, according to an exemplary embodiment of the present invention, a display device capable of preventing damage to the pad 13 likely to occur at the time of the separating of the TAB-ICs 20 and 30 from the pad 13 of the display panel 10 may be provided in order to reuse the display panel 10.

Figure 6:
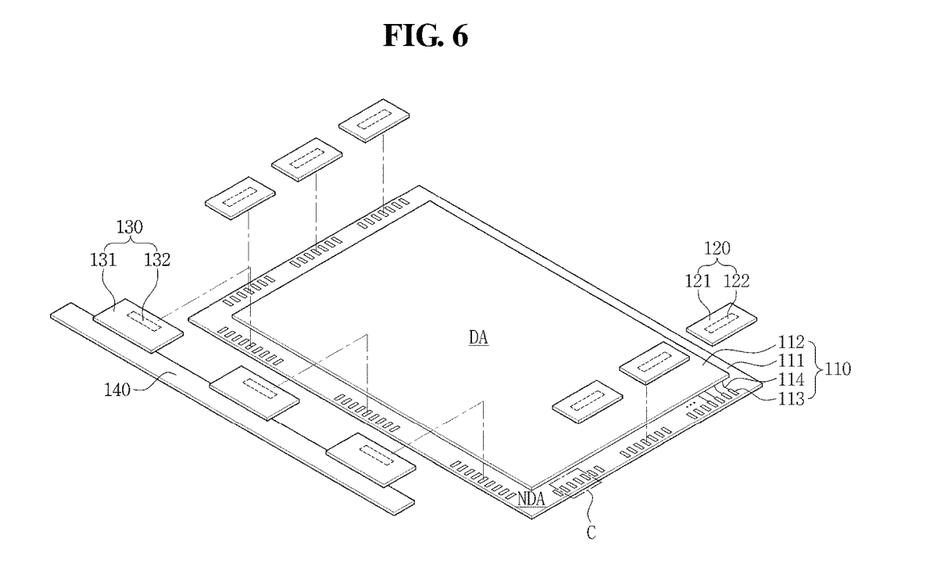
FIG. 6 is a schematic perspective view illustrating a display device according to an exemplary embodiment of the present invention.
Figure 7:
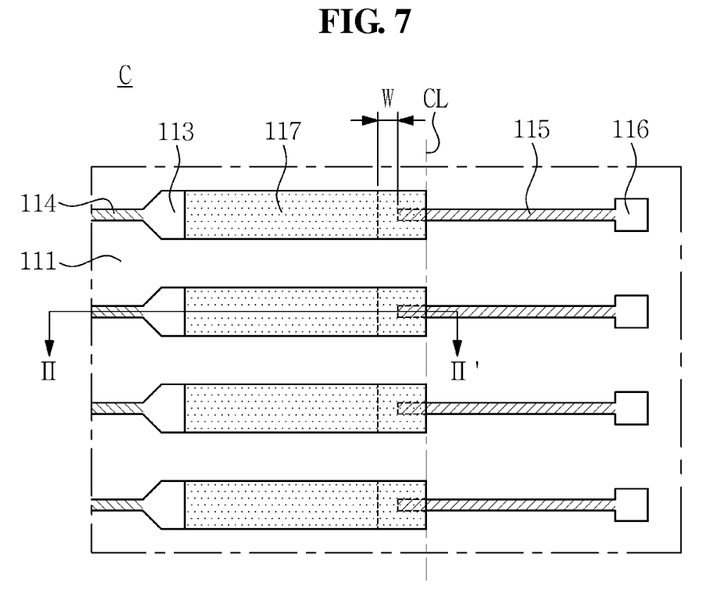
FIG. 7 is an enlarged partial view of area "C" of FIG. 6.
Figure 8:
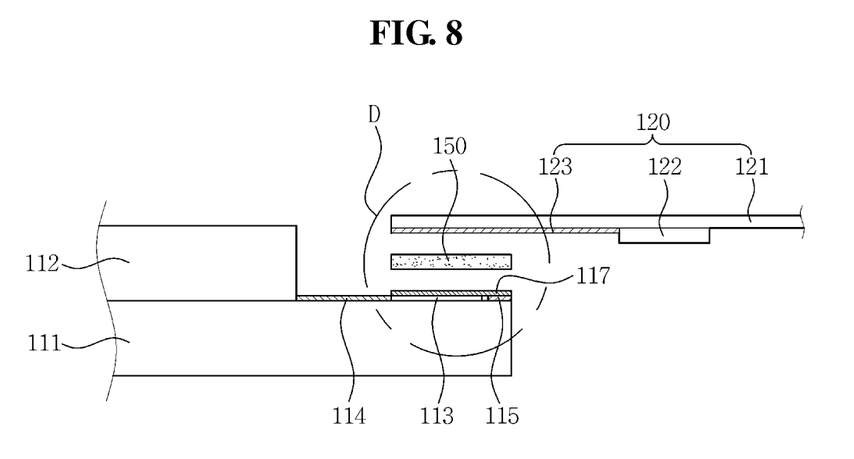
FIG. 8 is a cross-sectional view taken along line II-II' of FIG. 7.
Figure 9:
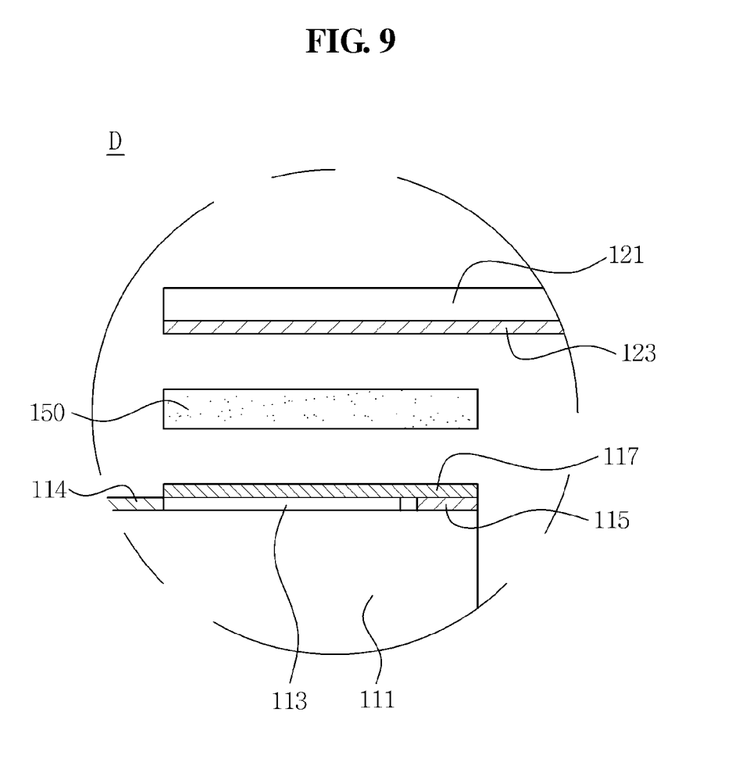
FIG. 9 is an enlarged partial view of area "D" of FIG. 8.

FIG. 6 is a schematic perspective view illustrating a display device according to an exemplary embodiment of the present invention; FIG. 7 is an enlarged partial view of area "C" of FIG. 6; FIG. 8 is a cross-sectional view taken along line I-I' of FIG. 2; and FIG. 9 is an enlarged partial view of area "D" of FIG. 8.

Referring to FIGS. 6 through 9, a display device according to an exemplary embodiment of the present invention may include a display panel 110 including a first substrate 111 and a second substrate 112 disposed to oppose one another, and a plurality of pads 113 disposed in an edge portion of the first substrate 111, a gate TAB-IC 120 and a data TAB-IC 130 bonded to the pad 113 of the first substrate 111, and a PCB 140 connected to the data TAB-IC 130.

The display panel 110 may be divided into a DA displaying an image and a NDA in an edge portion of the DA.

The display panel 110 may include a plurality of gate lines (not illustrated) and a plurality of data lines (not illustrated) disposed in the DA. In addition, the display panel 110 may include a TFT and a pixel electrode connected to the TFT disposed in a pixel area distinguished by the plurality of gate lines and the plurality of data lines.

The display panel 110 may include a plurality of pads 113 and connection wirings 114 disposed in the NDA. The pad 113 may transfer various types of externally supplied drive signals, and the connection wiring 114 may connect the gate line or the data line and the pad 113 to one another.

In a case in which the display panel 110 is an LCD, an LCD layer (not illustrated) may be interposed between the first substrate 111 and the second substrate 112. The LCD layer (not illustrated) may be rearranged by an electric field formed between the first substrate 111 and the second substrate 112. In addition, although not illustrated in FIG. 5, a lower polarizing plate and an upper polarizing plate may further be disposed on a lower surface of the first substrate 111 and an upper surface of the second substrate 112, respectively. The upper polarizing plate and the lower polarizing plate may each have an area corresponding to an area of the display panel 110. The upper polarizing plate may pass through a predetermined component of polarized light from among externally supplied light, and may absorb or block the remainder of the externally supplied light. The lower polarizing plate may pass through a predetermined component of polarized light from among the light emitted from a backlight unit, and may absorb or block the remainder of the light emitted from the backlight unit.

The gate TAB-IC 20 may include an FPCB 121, a gate IC 122 mounted on the FPCB 121, and a lead wiring 123 extending from the gate IC 122. The gate TAB-IC 20 may supply a gate control signal supplied from the PCB 140 to the gate IC 122, and may supply a gate-on voltage output from the gate IC 122 to each gate line.

Similarly, the data TAB-IC 130 may include an FPCB 131, a data IC 132 mounted on the FPCB 131, and a lead wiring (not illustrated) extending from the data IC 132. The data TAB-IC 30 may supply a data signal and a control signal supplied from the PCB 140 to the data IC 132, and may supply an image voltage output from the data IC 132 to each data line.

The number of gate TAB-ICs 120 and data TAB-ICs 130 may be provided in various manners based on a size and a driving scheme of the display panel 110.

The lead wiring 123 of the gate TAB-IC 120 and the lead wiring of the data TAB-IC 130 may be bonded to the pad 113 of the first substrate 111. The lead wiring 123 of the gate TAB-IC 120 and the pad 113 of the first substrate 111 may be electrically connected to one another using an ACF 150. The ACF 150 may be a thermosetting resin film including conductive particles.

The PCB 140 may be disposed in at least a side portion of the display panel 110. The PCB 140 may supply various types of control signals and power signals for driving the display panel 110.

Referring to FIGS. 7 through 9, in the display device according to the exemplary embodiment, an inspection line 115 and an inspection pad 116 may be disposed in an edge portion of the first substrate 111. One end of the inspection line 115 may be disposed to be spaced apart from the pad 113, and the other end of the inspection line 115 may be connected to the inspection pad 116. One end of the inspection line 115 and the pad 113 may be connected via a conductive member 117.

The inspection pad 116 may transfer various types of externally applied inspection signals. Various types of inspection signals input to the inspection pad 116 may be applied to respective pixels through the inspection line 115, the conductive member 117, and the pad 113. A scheme of inspecting the display panel 110 may include, for example, a VI, a gross test (GT), a final test, an array test, and the like.

Subsequently to completing various types of inspections, a display panel 110 having a narrow bezel may be formed by cutting the first substrate 111 along a cutting line CL. In this instance, a portion of the inspection line 115 connected to the pad 113 via the conductive member 117 may remain on the first substrate 111.

A distance W between the pad 113 and the inspection line 115 may be in a range of about 5 micrometers (μm) to 50 μm. In addition, the conductive member 117 connecting the pad 113 and the inspection line 115 may be disposed on the pad 113 and the inspection line 115.

The pad 113, the connection wiring 114, the inspection line 115, and the inspection pad 116 may include at least one selected from the group consisting of chrominum (Cr), aluminum (Al), molybdenum (Mo), titanium (Ti), tungsten (W), and gold (Au).

The conductive member 117 may include transparent conductive oxide (TCO), and such TCO may include at least one selected from the group consisting of indium tin oxide (ITO), indium zinc oxide (IZO), indium tin zinc oxide (ITZO), and zinc oxide (ZnO).

Figure 10:
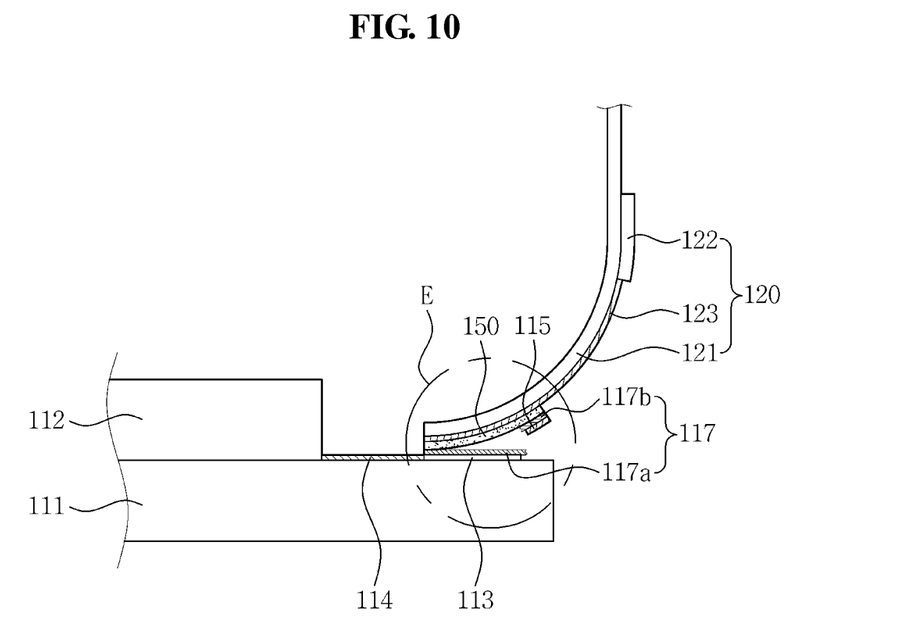
FIG. 10 is a cross-sectional view illustrating an example in which a TAB-IC is separated from a display panel according to an exemplary embodiment of the present invention.
Figure 11:
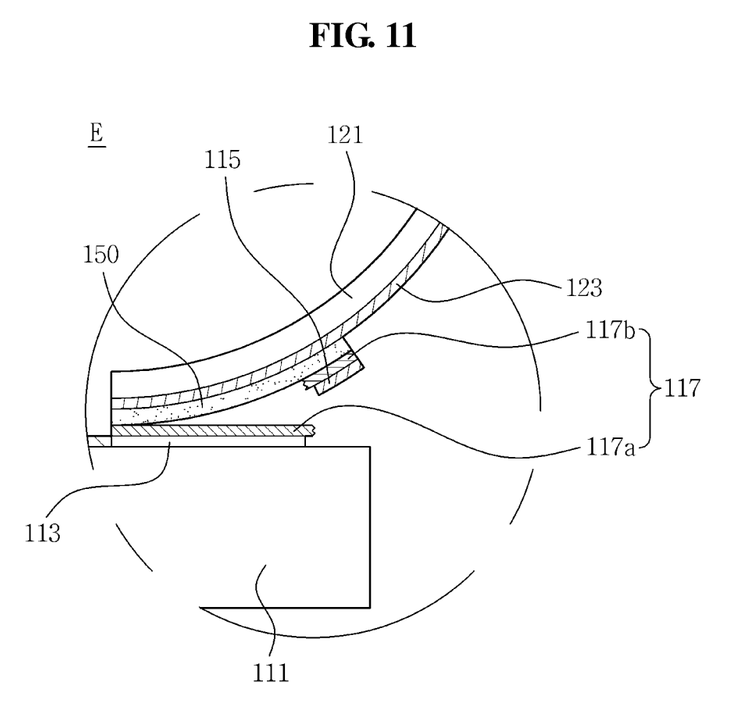
FIG. 11 is an enlarged partial view of area "E" of FIG. 10.

FIG. 10 is a cross-sectional view illustrating an example in which a TAB-IC is separated from a display panel according to an exemplary embodiment of the present invention; and FIG. 11 is an enlarged partial view of area "E" of FIG. 10.

Referring to FIGS. 10 and 11, during a process of cutting the first substrate 111, bonding strength between the portion of the inspection line 115 remaining on the first substrate 111 and the first substrate 111 may be lessened. Consequently, at the time of separating the TAB-ICs 120 and 130 bonded onto the pad 113 and the portion of the inspection line 115 remaining on the first substrate 111, the portion of the inspection line 115 may be peeled off from the first substrate 111 together with the TAB-ICs 120 and 130. However, since the portion of the inspection line 115 remaining on the first substrate 111 and the pad 113 are not directly connected to one another, only the portion of the inspection line 115 remaining on the first substrate 111 may be peeled off from the first substrate 111 other than the pad 113.

In addition, the conductive member 117 disposed on the pad 113 and the inspection line 115 may be formed to include TCO, and such TCO may have characteristics of being susceptible to breakage in a case of external force being applied thereto.

In other words, in a case of the portion of the inspection line 115 remaining on the first substrate 111 being separated from the first substrate 111, the conductive member 117 may be divided into a conductive member 117a disposed on the pad 113 and a conductive member 117b disposed on the inspection line 115.

Accordingly, in the case of the display device according to the exemplary embodiment, in a case in which the TAB-IC 120 is separated from the display panel 110, only the inspection line 115 and the conductive member 117b disposed on the inspection line 115 may be separated from the display panel 110 together with the TAB-IC 120, and the pad 113 and the conductive member 117a disposed on the pad 113 may remain on the first substrate 111.

As set forth above, according to exemplary embodiments of the present invention, the display device may prevent damage to the pad likely to occur at the time of the separating of the TAB-ICs and from the pad of the display panel in order to reuse the display panel.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
   a substrate including a display area in which a plurality of pixels are disposed and a non-display area adjacent to the display area;
   a pad disposed in the non-display area;
   an inspection line disposed on the substrate to overlap a cutting line so as to form, upon being cut, a remaining portion of the inspection line with a cut edge disposed in the non-display area of the substrate and being spaced apart from the pad;
   a conductive member connecting the pad to the remaining portion of the inspection line; and
   a tape-automated bonding integrated circuit (TAB-IC) disposed on the conductive member, the conductive member disposed between the pad and the tape-automated bonding integrated circuit, the TAB-IC includes a flexible printed circuit board (FPCB), a drive integrated circuit (IC) mounted on the FPCB, and a lead wiring extending from the drive IC;
   wherein the FPCB and the lead wiring overlap both the pad and the remaining portion of the inspection line.

2. The display device of claim 1, further comprising a gate line and a data line disposed on the substrate, wherein the pad is connected to the gate line and the data line.

3. The display device of claim 1, wherein the remaining portion of the inspection line is disposed in an outer portion of the non-display area than the pad.

4. The display device of claim 3, wherein the remaining portion of the inspection line is spaced apart from the pad by a distance in a range of about 5 micrometers (μm) to 50 μm.

5. The display device of claim 1, wherein the pad and the remaining portion of the inspection line include at least one selected from the group consisting of chrominum (Cr), aluminum (Al), molibden (Mo), titanium (Ti), tungsten (W), and gold (Au).

6. The display device of claim 1, wherein the conductive member includes at least one selected from the group consisting of indium tin oxide (ITO), indium zinc oxide (IZO), indium tin zinc oxide (ITZO), and zinc oxide (ZnO).

7. The display device of claim 1, wherein the drive IC includes one selected from the group consisting of a gate IC and a data IC.

8. The display device of claim 1, wherein the lead wiring is electrically connected to the conductive member.

9. The display device of claim 1, further comprising an anisotropic conductive film (ACF) disposed between the lead wiring and the conductive member.

10. The display device of claim 1, wherein an area where the TAB-IC overlaps the pad is larger than an area where the TAB-IC overlaps the remaining portion of the inspection line.

11. A display device, comprising:
    a first substrate;
    a second substrate disposed on the first substrate having a plurality of pixels, said first substrate having a larger surface area than the second substrate, the first and second substrates have a rectangular shape;
    a pad disposed on the first substrate;
    an inspection line disposed on the first substrate to overlap a cutting line so as to form, upon being cut, a remaining portion of the inspection line with a cut edge;
    a conductive member connecting the pad to the remaining portion of the inspection line; and
    a tape-automated bonding integrated circuit (TAB-IC) disposed on the conductive member, the conductive member disposed between the pad and the tape-automated bonding integrated circuit, the TAB-IC includes a flexible printed circuit board (FPCB), a drive integrated circuit (IC) mounted on the FPCB, and a lead wiring extending from the drive IC;
    wherein the pad, the remaining portion of the inspection line and the TAB-IC have no direct contact with the second substrate,
    wherein the FPCB and the lead wiring overlap both the pad and the remaining portion of the inspection line.

12. The display device of claim 11, further comprising a gate line and a data line disposed on the first substrate, wherein the pad is connected to the gate line and the data line.

13. The display device of claim 11, wherein the remaining portion of the inspection line has a rectangular prism shape with four sides and two ends with one of the two ends directly physically connected to an inspection pad and another of the two ends having a distance from the pad in a range of about 5 micrometers (μm) to 50 μm.

14. The display device of claim 11, wherein the pad and the remaining portion of the inspection line include at least one selected from the group consisting of chrominum (Cr), aluminum (Al), molibden (Mo), titanium (Ti), tungsten (W), and gold (Au).

15. The display device of claim 11, wherein the conductive member includes at least one selected from the group consisting of indium tin oxide (ITO), indium zinc oxide (IZO), indium tin zinc oxide (ITZO), and zinc oxide (ZnO).

16. The display device of claim 11, wherein the drive IC includes one selected from the group consisting of a gate IC and a data IC.

17. The display device of claim 11, further comprising an anisotropic conductive film (ACF) disposed between the lead wiring and the conductive member.

18. The display device of claim 11, wherein an area where the TAB-IC overlaps the pad is larger than an area where the TAB-IC overlaps the remaining portion of the inspection line.

* * * * *

UNITED STATES PATENT AND TRADEMARK OFFICE
CERTIFICATE OF CORRECTION

| | | |
|---|---|---|
| PATENT NO. | : 10,455,693 B2 | Page 1 of 1 |
| APPLICATION NO. | : 14/724370 | |
| DATED | : October 22, 2019 | |
| INVENTOR(S) | : Myongsoo Oh | |

It is certified that error appears in the above-identified patent and that said Letters Patent is hereby corrected as shown below:

On the Title Page

Item (71) Applicant: should be changed from "Samsung Display Co., Ltd., Yongin, Gyeonggi-Do (KR)" to --Samsung Display Co., Ltd., Yongin-si, Gyeonggi-Do (KR)--

Item (72) Inventor: should be changed from "Myong soo Oh, Asan-si" to --Myongsoo Oh, Asan-si--

Signed and Sealed this
Second Day of March, 2021

Drew Hirshfeld
*Performing the Functions and Duties of the
Under Secretary of Commerce for Intellectual Property and
Director of the United States Patent and Trademark Office*